United States Patent

Wu et al.

[11] Patent Number: 5,810,947
[45] Date of Patent: Sep. 22, 1998

[54] METHOD OF SURFACE MODIFICATION FOR TOOL STEELS

[75] Inventors: Jiann-Kuo Wu, Keelung; Fu-Der Lai, Taipei, both of Taiwan

[73] Assignee: National Science Council, Taipei, Taiwan

[21] Appl. No.: 782,577

[22] Filed: Jan. 10, 1997

[51] Int. Cl.$^6$ .................................. C23C 8/26; C23C 8/32
[52] U.S. Cl. ........................ 148/220; 148/218; 148/219; 148/222; 148/228; 148/230; 148/518; 148/530
[58] Field of Search ..................................... 148/218, 219, 148/220, 222, 228, 230, 518, 530

[56] References Cited

FOREIGN PATENT DOCUMENTS

| | | | |
|---|---|---|---|
| 1177357 | 7/1989 | Japan | 148/220 |
| 8607614 | 12/1986 | WIPO | 148/220 |

OTHER PUBLICATIONS

"Structure, hardness and adhesion properties of CrN films deposited on nitrided and nitrocarburized SKD 61 tool steels," F.D. LAI and J.K. WU, *Surface and Coatings Technology* 1996, Jan. 1997.

*Primary Examiner*—Deborah Yee
*Attorney, Agent, or Firm*—Beveridge, DeGrandi, Weilacher & Young, L.L.P.

[57] ABSTRACT

The adhesive strength and hardness of chromium nitride (CrN) film deposited on SKD 61 tool steel was significantly enhanced by a nitriding process on the surface the tool steel before coating with a CrN film. These nitriding processes included nitrocarburing, gas nitriding, and plasma nitriding, respectively. After nitriding, the surface of tool steel was repolishing with grits #600, #1000, #1800 of SiC grinding paper, as well as #1000 grinding paper and diamond paste, respectively. After repolishing, the CrN film was deposited by the cathodic arc ion plating deposition process at low temperatre of 200° C. The present invention was related to the process modification for enhancing the adhesive strength and surface hardness of CrN film deposited on tool steels. This method included a nitriding process and a repolishing followed by the cathodic arc ion plating deposition.

12 Claims, 18 Drawing Sheets

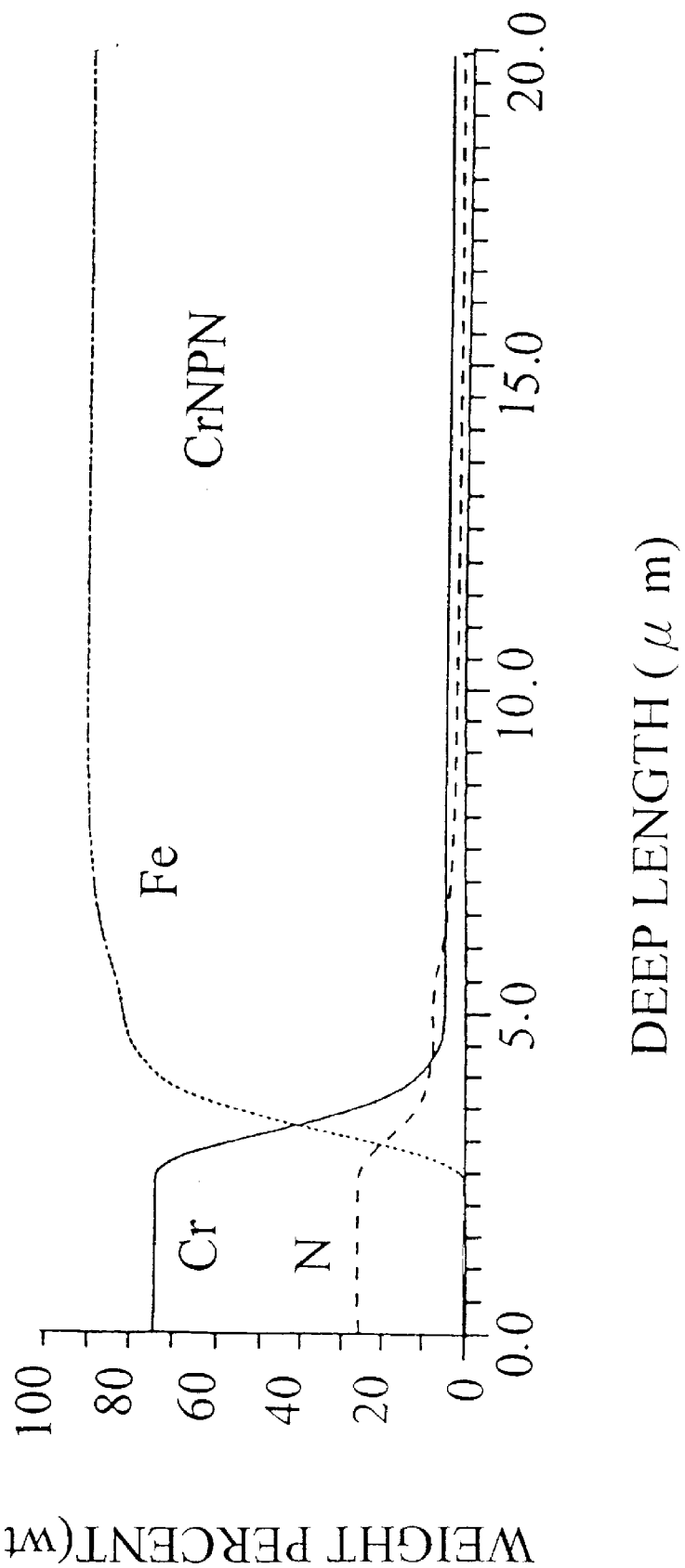

METHOD OF SURFACE MODIFICATION FOR TOOL STEELS

DETAILED DESCRIPTION

BACKGROUND

Coating method is becoming an important method for modifying properties of materials. The adhesive strength and tribology of the coating layer can change the surface condition. The complexed layer includes a hard coated film and a nitrided layer. For instance, in 1995, E. T. Meletis et al. reported in Surface and Coatings Technology, volume 73, page 39, and S. C. Lee et al. also reported in volume 73, page 34 in the same journal, regarding the coating property and capability of a hard coated film that could be improved by using diffusional plasma nitriding on the surface of hard material, followed by combining with titanium nitride(TiN) to form a complexed layer.

The property of a coated film is dependent on the hardness and adhesive strength of the coated layer. For instance, in 1994, F. D. Lai et al. revealed in Surface and Coatings Technology, volume 64, page 53, regarding the ion plating method, which could give a coated film with high density and good adhesion. When coated with CrN, properties such as hardness, density, adhesive strength, and anti-corrosion, were significantly enhanced.

The primary purpose of the present invention was to provide a novel method for modify the surface property of tool steel, so that the surface adhesive strength and hardness were enhanced, and the life of usage was significantly increased. Another purpose of the present invention was to provide a standard procedure of pretreatment, nitriding, repolishing, and CrN coating deposited on the surface of steel tool.

SUMMARY OF THE INVENTION

The present invention was a novel method for surface modification of tool steel. The adhesive strength and hardness of CrN film deposited on SKD 61 tool steel was enhanced. The modification process included plasma nitriding, or gas nitriding, or nitrocarburizing. Then the tool steel was cleaned and repolished with different grinding papers. The adhesive strength and hardness of CrN film deposited on the surface of the tool steel was significantly increased.

BRIEF DESCRIPTION OF THE TABLES AND DRAWINGS

Table 1. The amounts nitrogen and carbon weight percents in the surface of the plasma nitrided(PNSKD), gas nitrided (GNSKD) and nitrocarburized(NCSKD) samples.

Table 2. Microhardness of various samples. HV0.050, HV0.100, HV0.300 referred to values of hardness obtained by a Vickers hardness tester under a load of 50, 100, 300 g for 10 Sec., respectively.

Table 3. Fracture surface of various samples, followed by repolishing with #1000 granding paper and CrN deposition, after indentation test. P—Perfect C1—slightly horizontal crack C2—light vertical and horizontal crack F1—C2with slight peeling off F2—C2with completely peeling off Table 4. The critical load for causing coating damage by scratch test.

Repolishing processes included without repolishing, #600 grinding paper, #1000 granding paper, #1800 grinding paper, #1000 granding paper and diamond paste, respectively.

Figure 1:
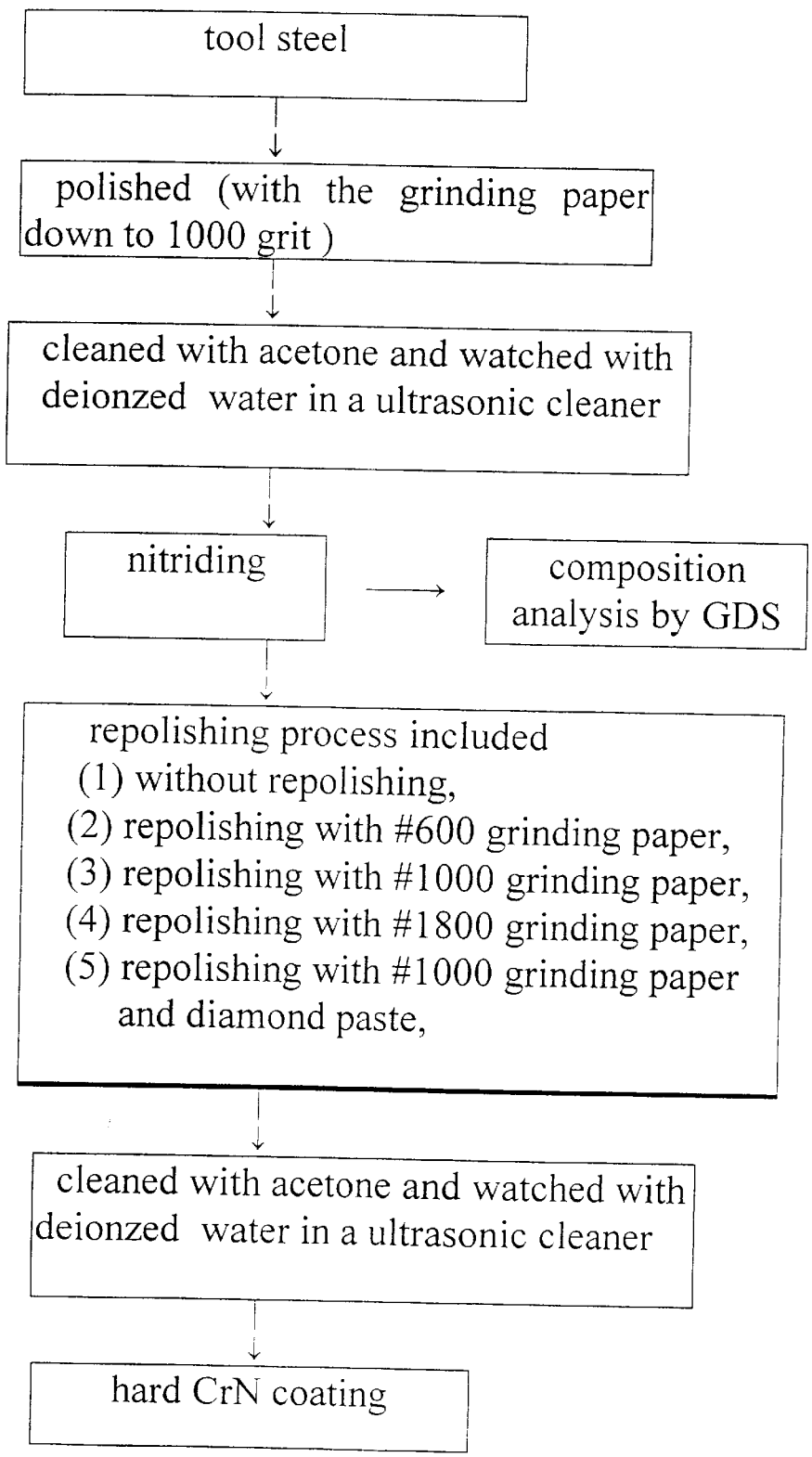
Figure 2A:
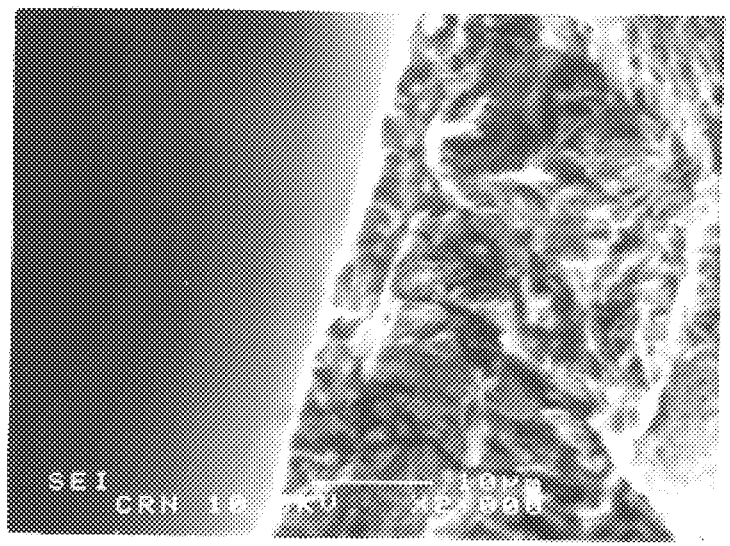
Figure 2B:
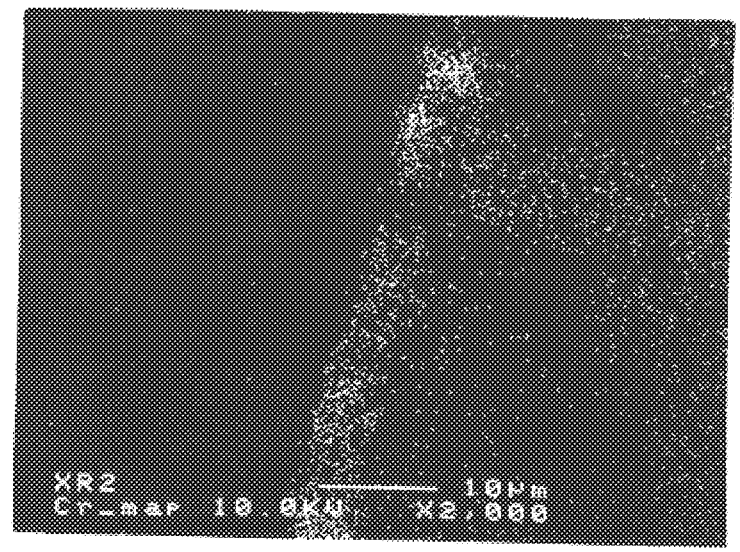
Figure 2C:
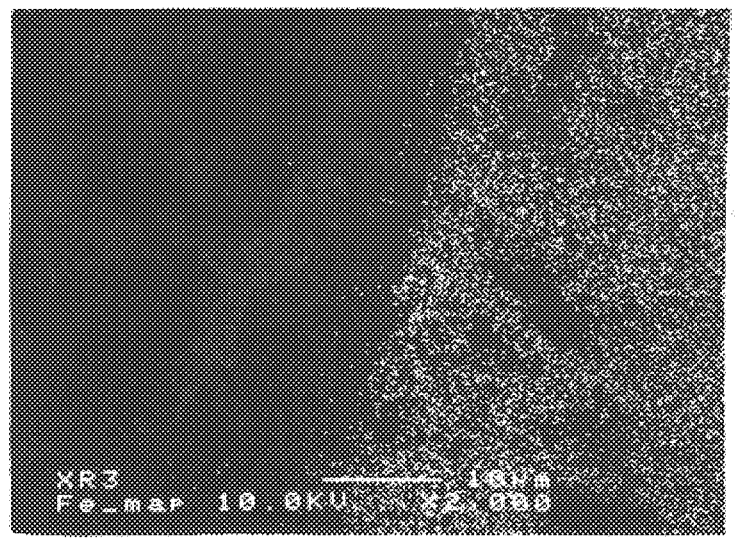
Figure 7A:
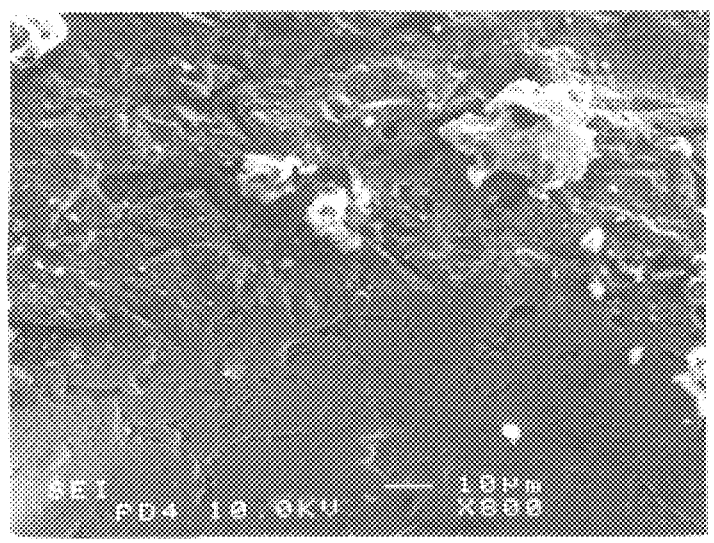
Figure 3:
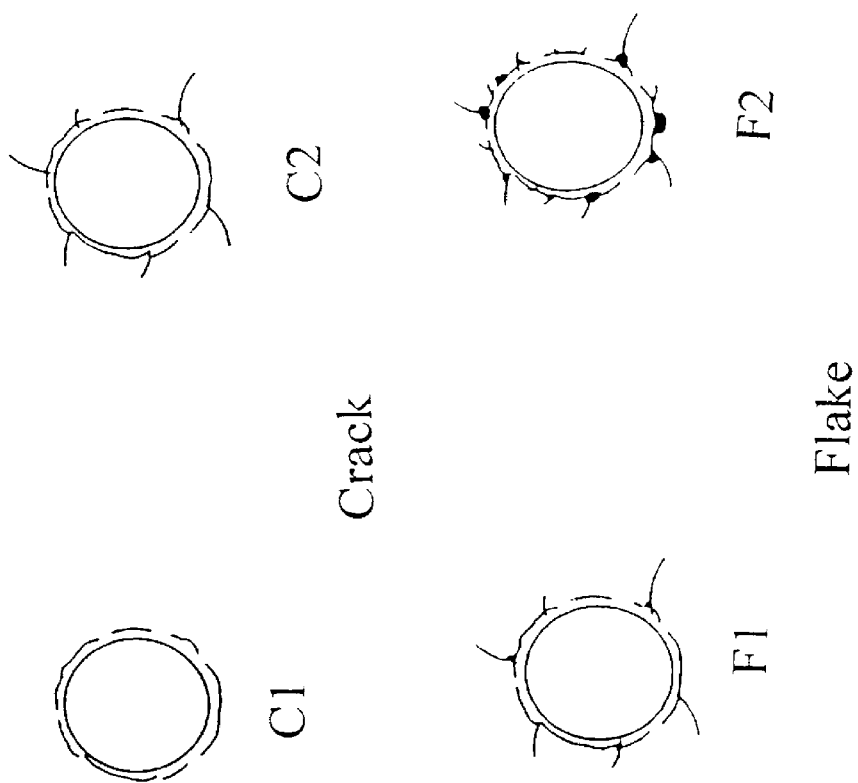
Figure 4A:
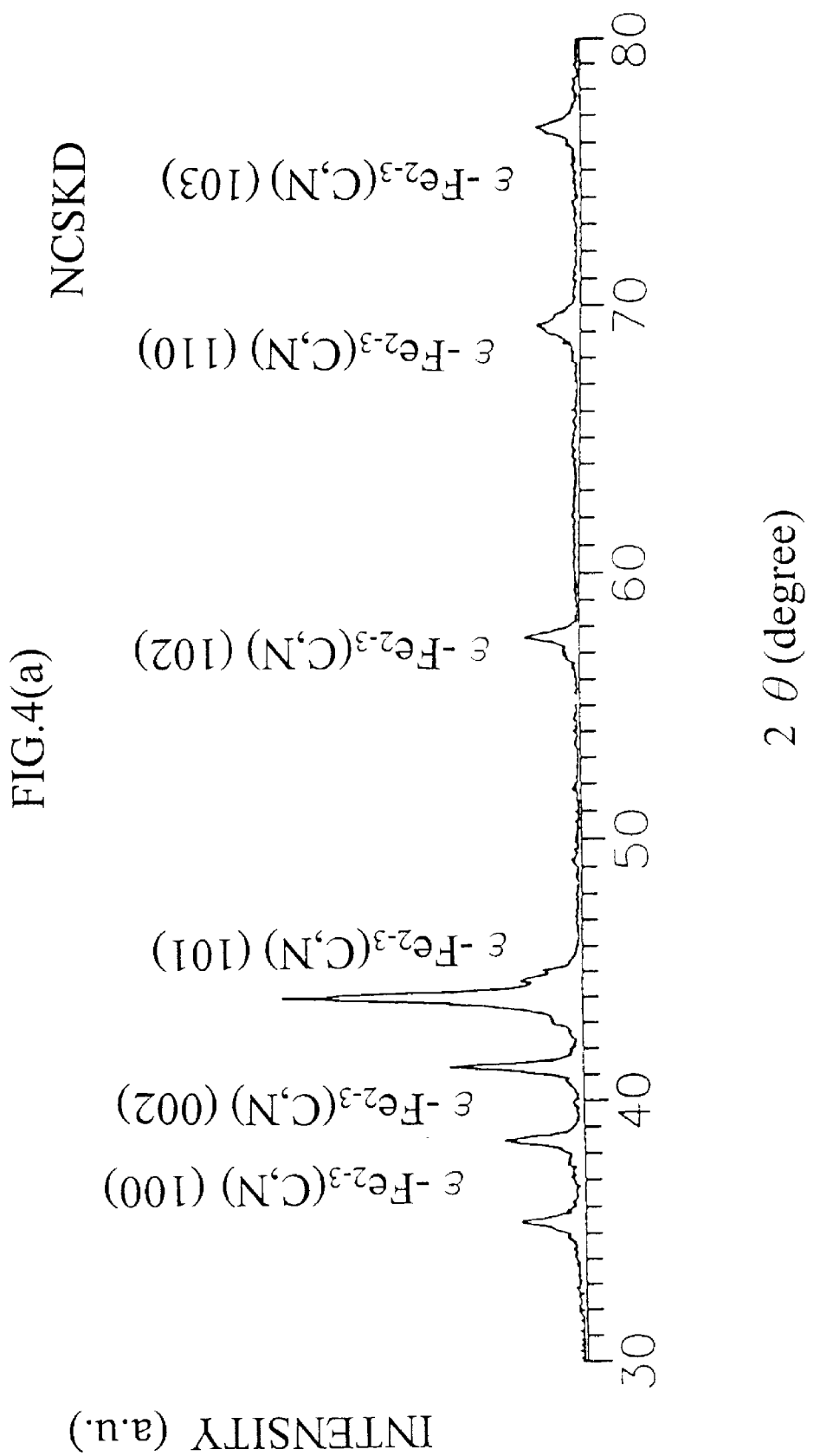
Figure 4B:
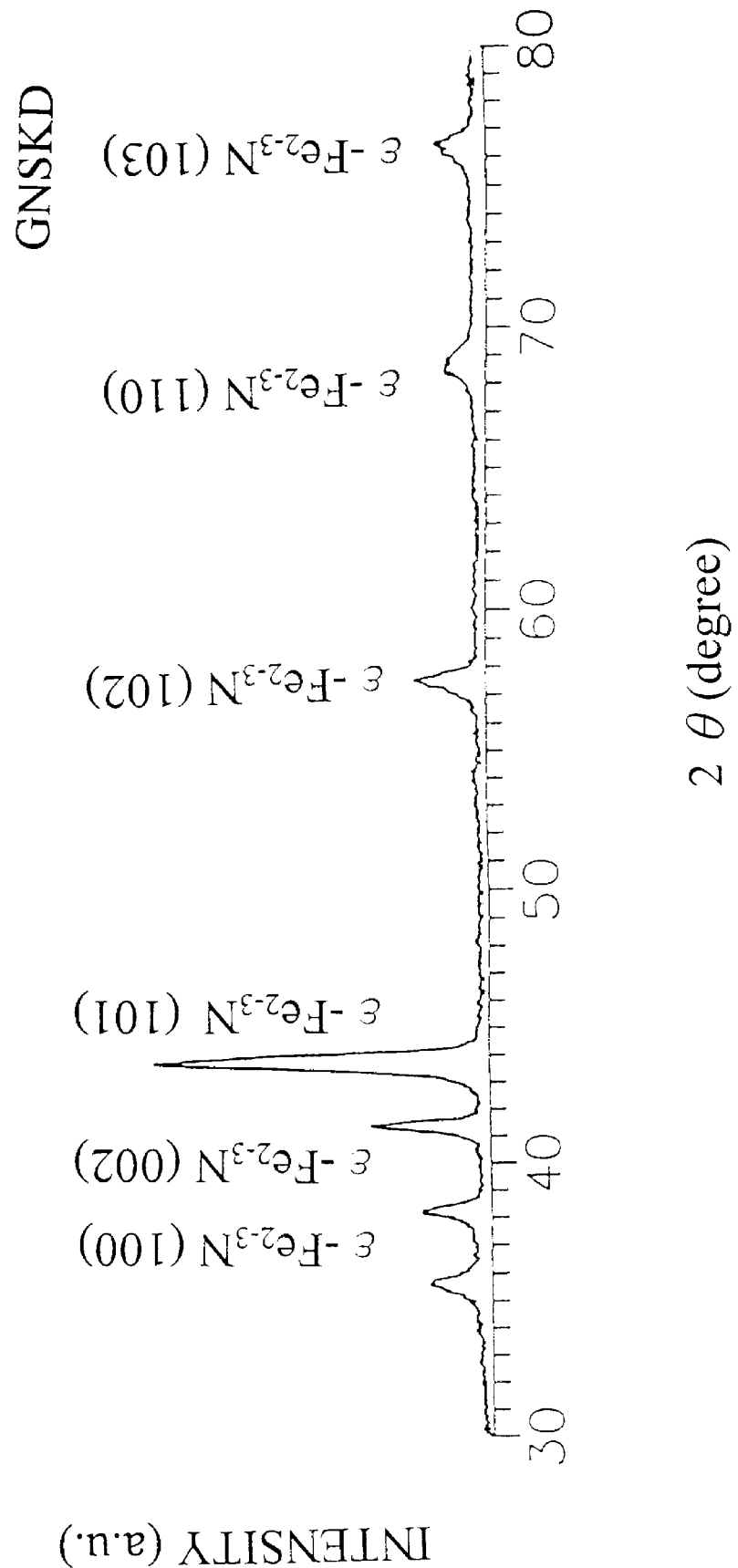
Figure 4C:
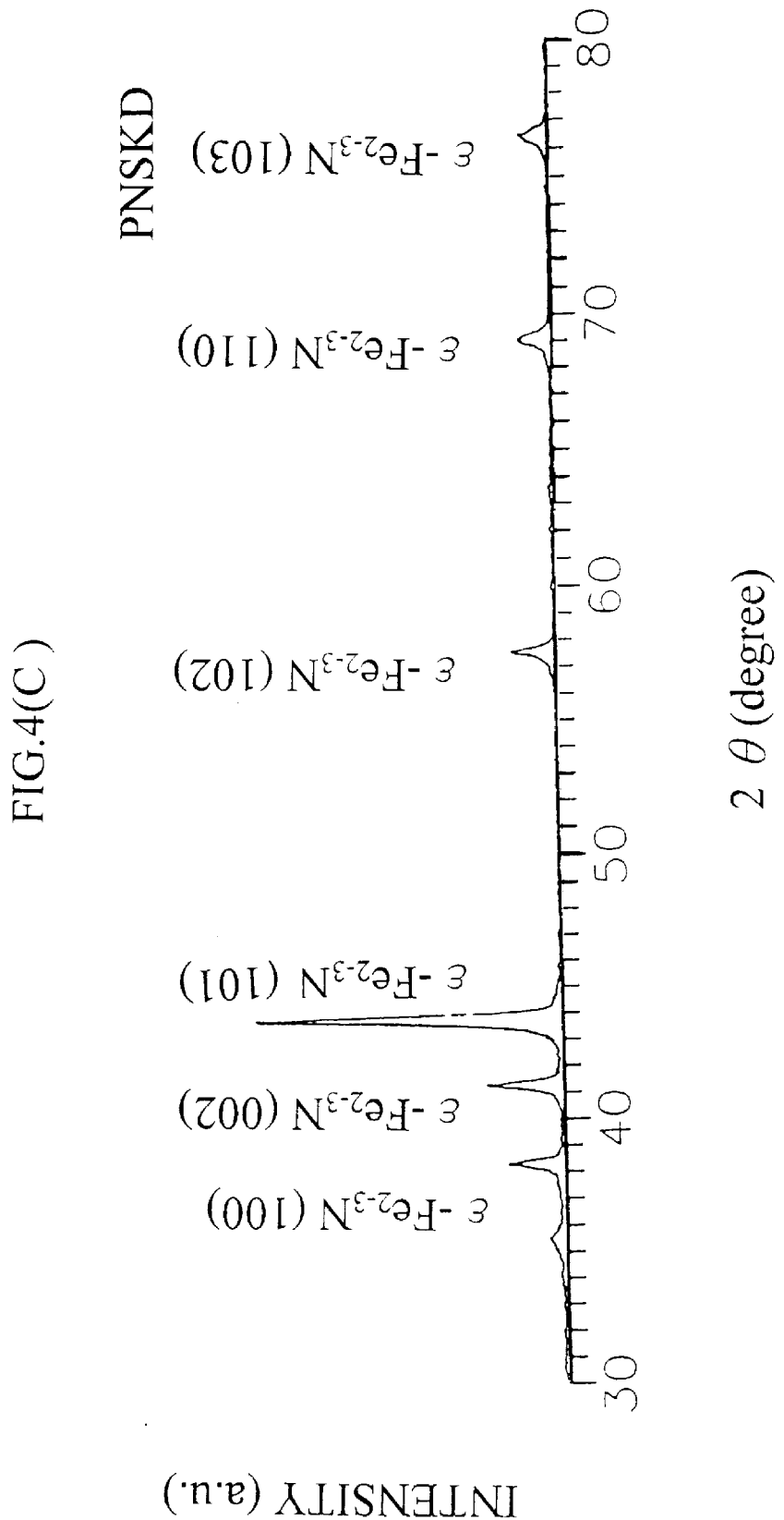
Figure 4D:
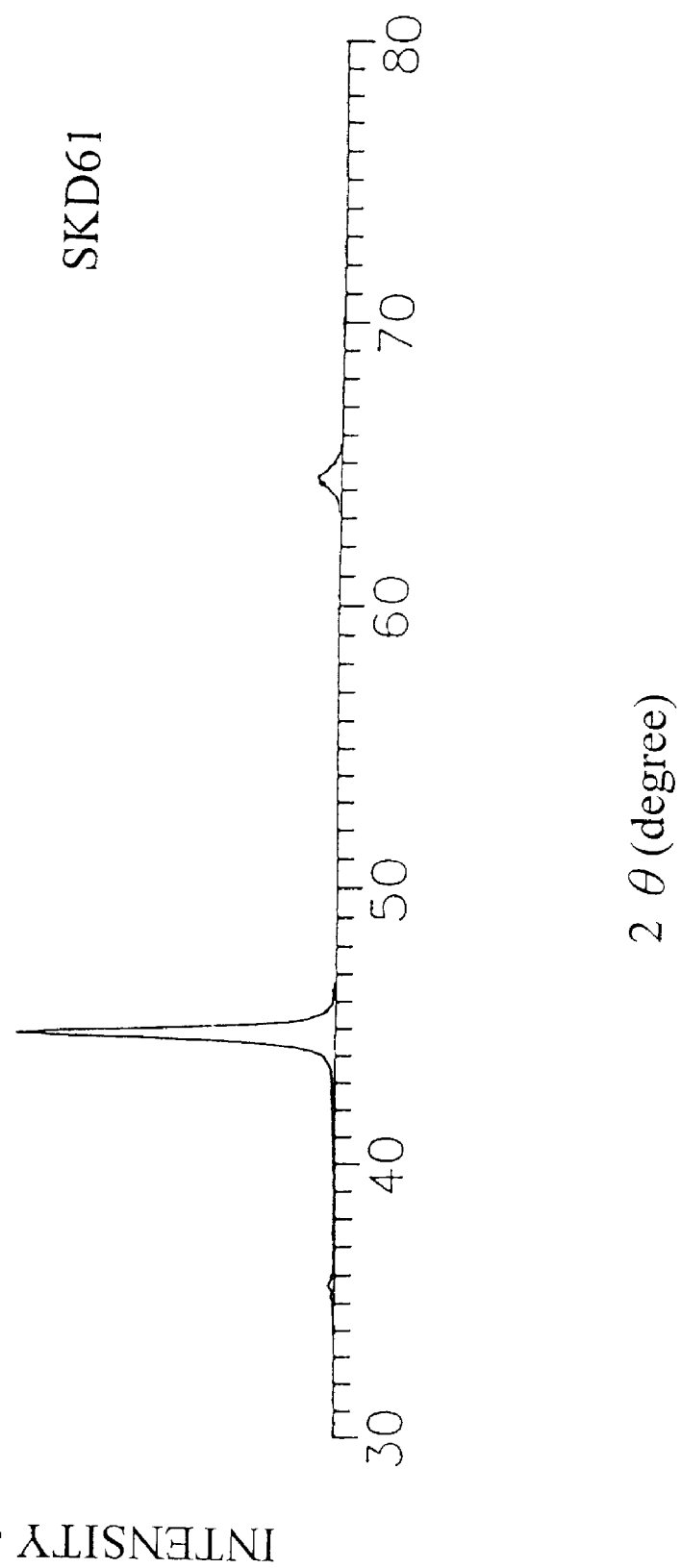
Figure 5A:
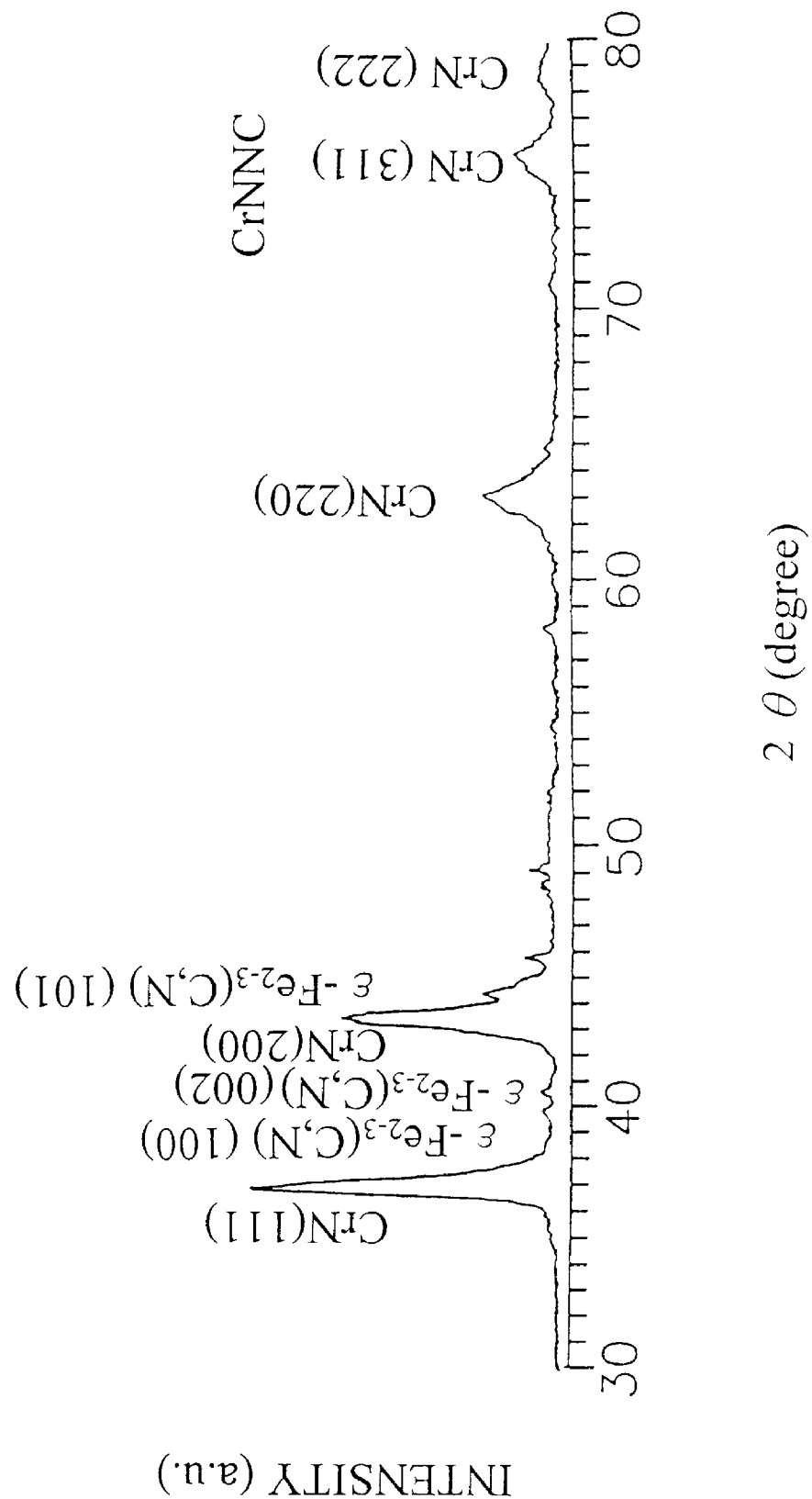
Figure 5B:
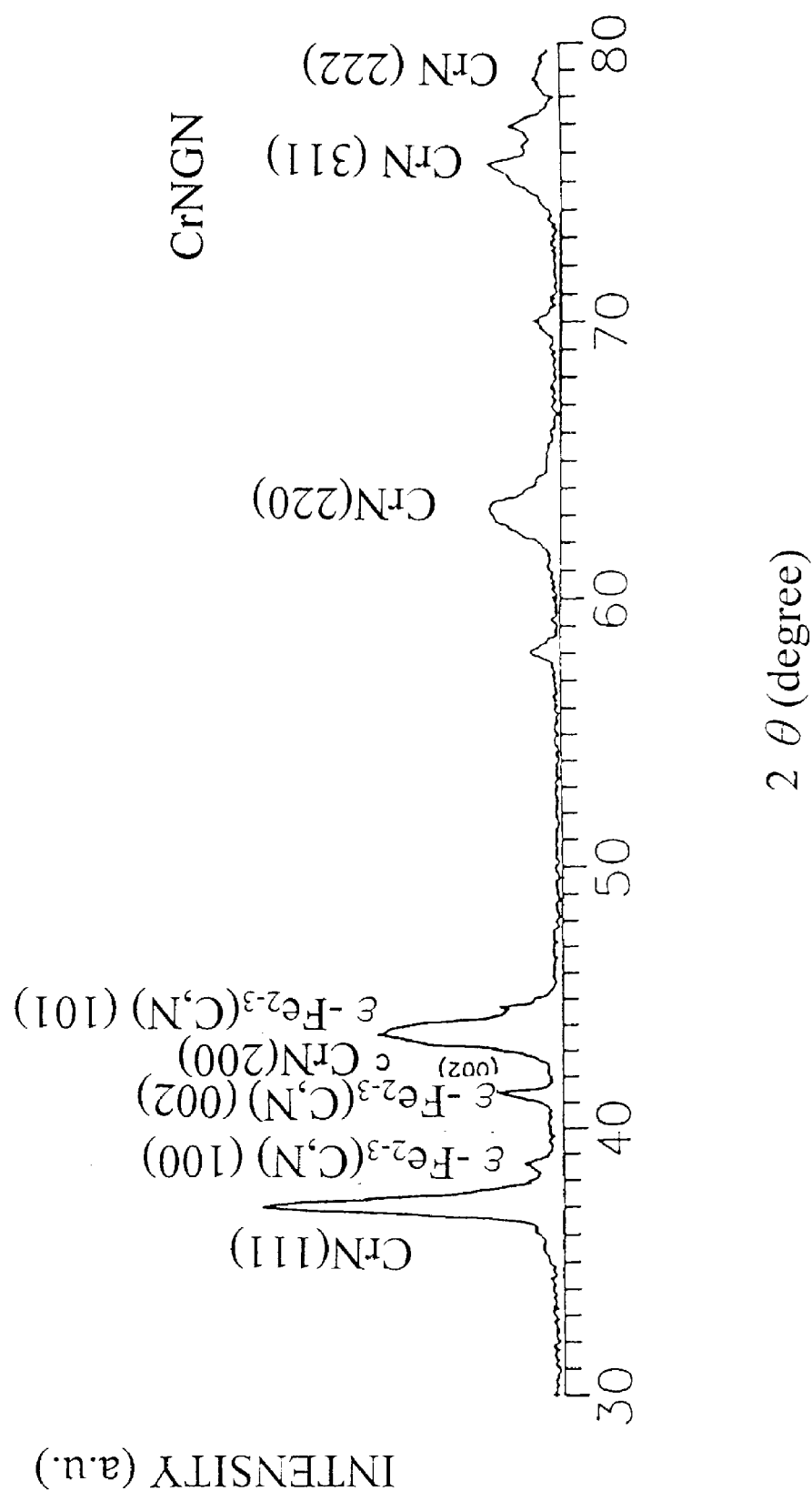
Figure 5C:
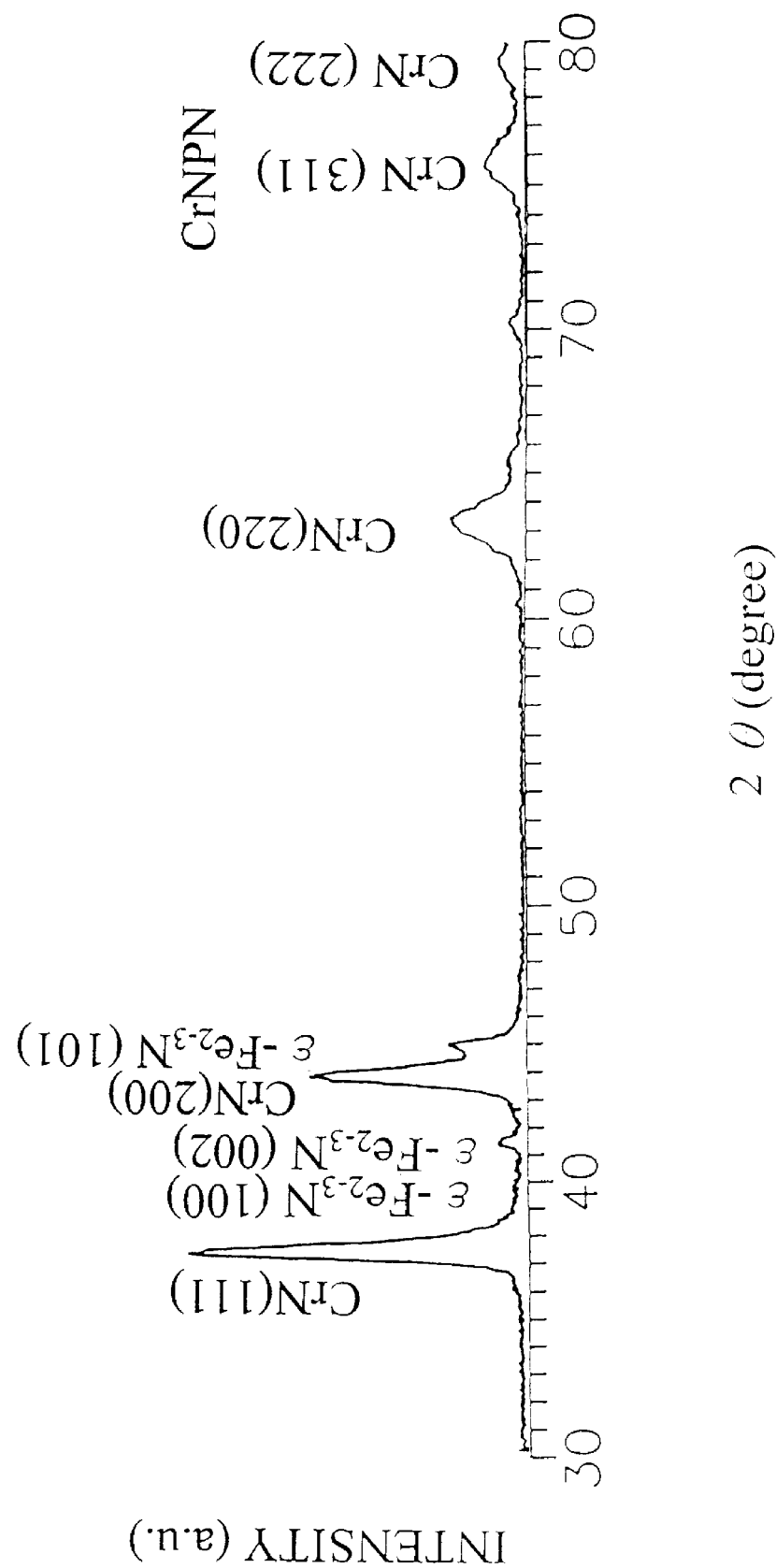
Figure 5D:
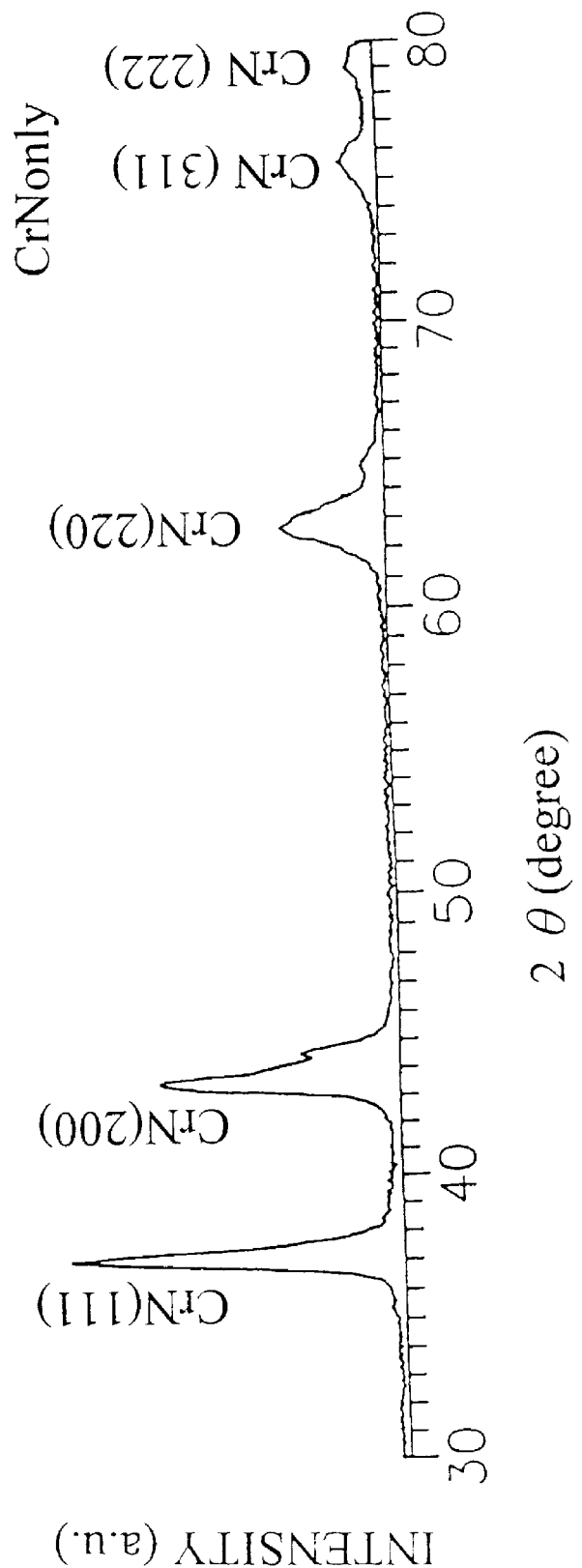
Figure 6A:
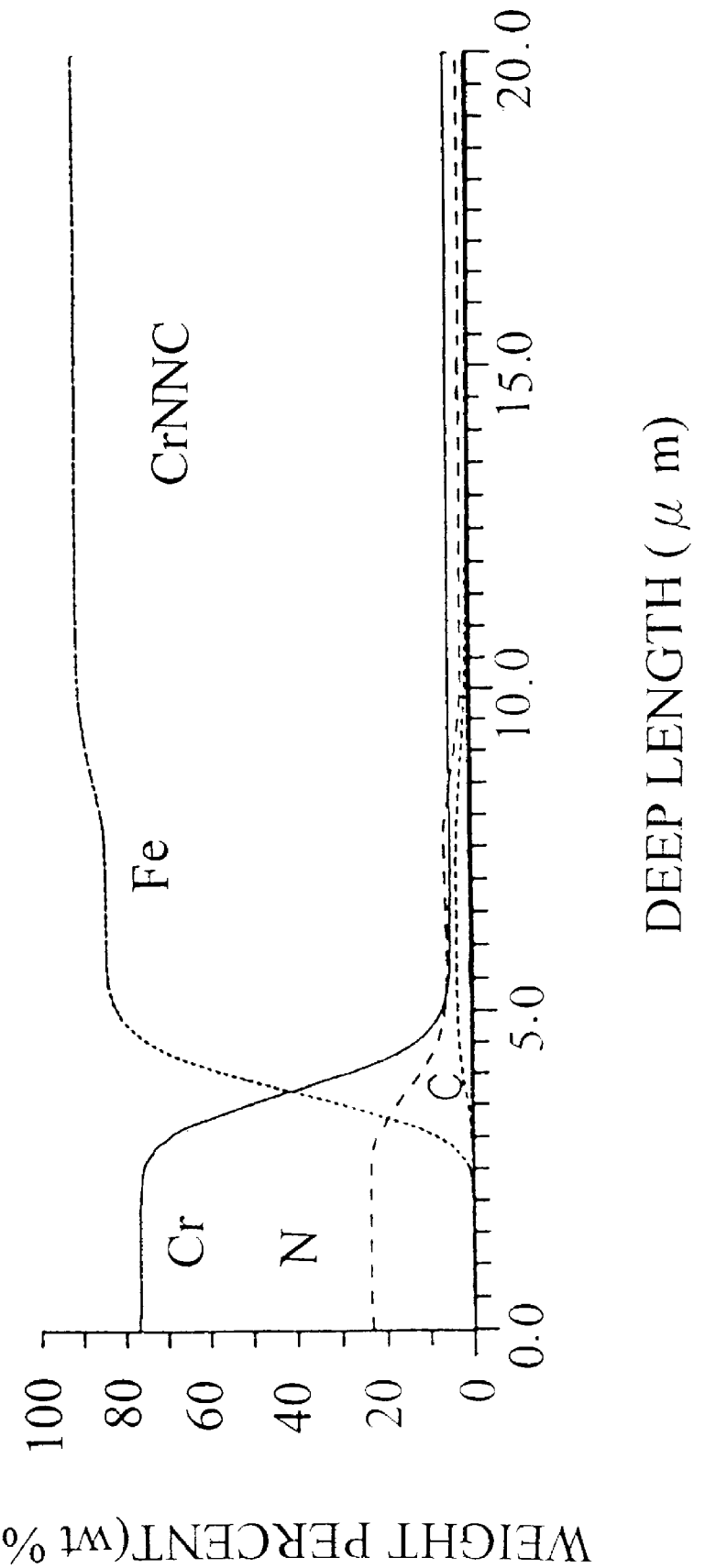
Figure 6B:
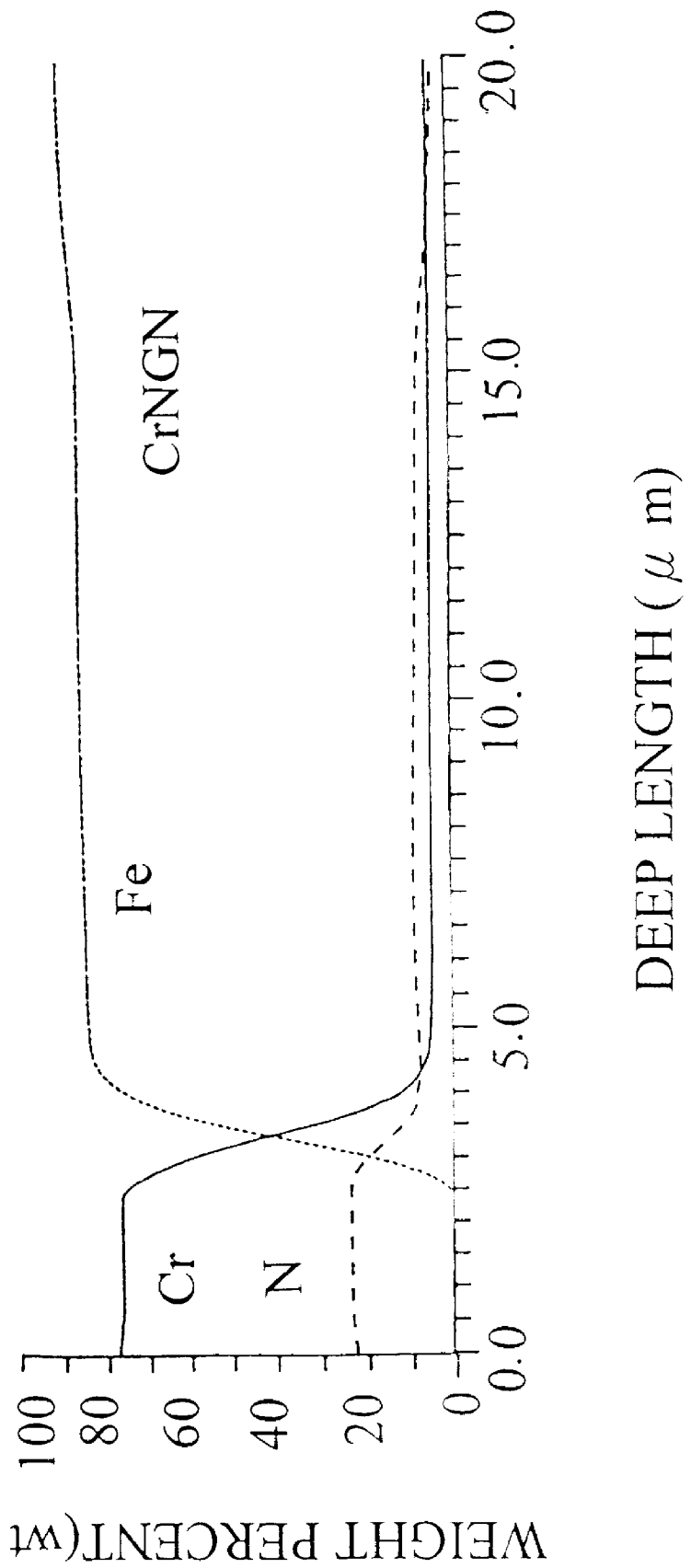
Figure 6D:
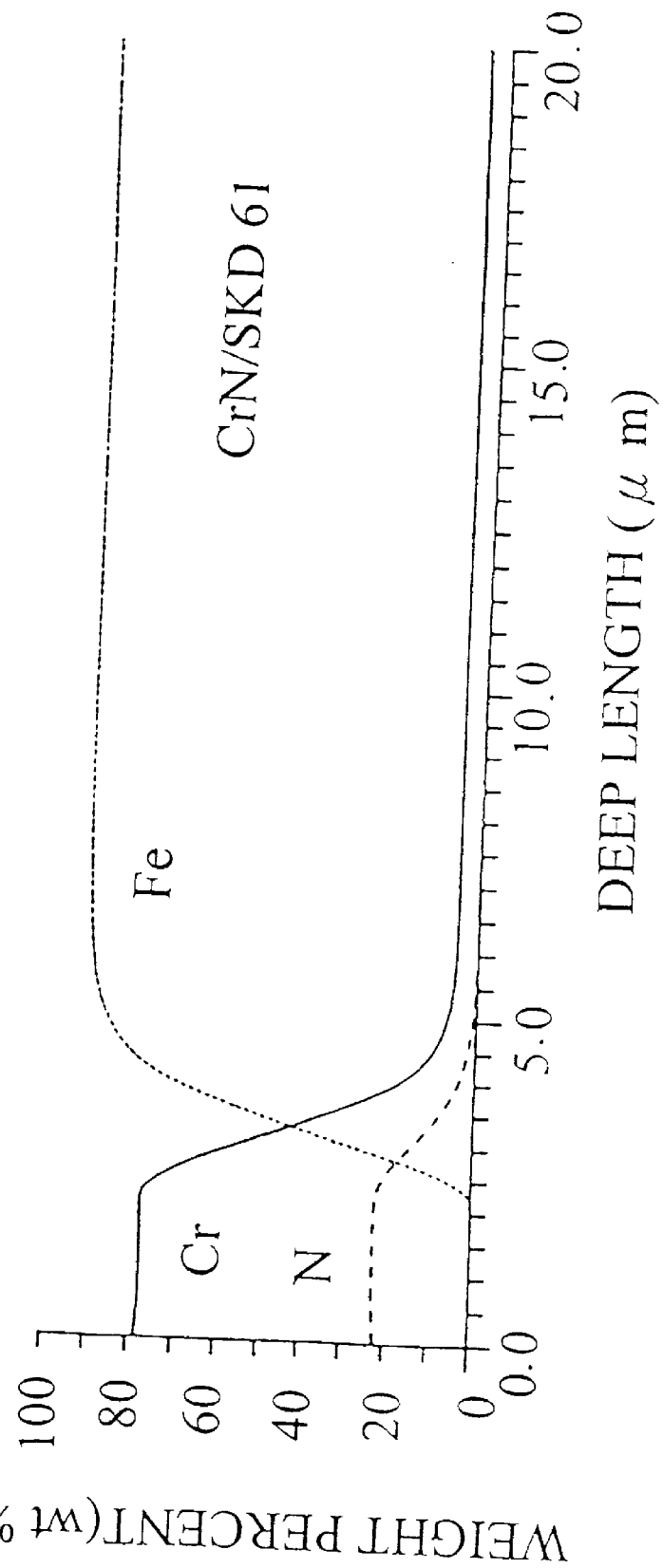
Figure 7B:
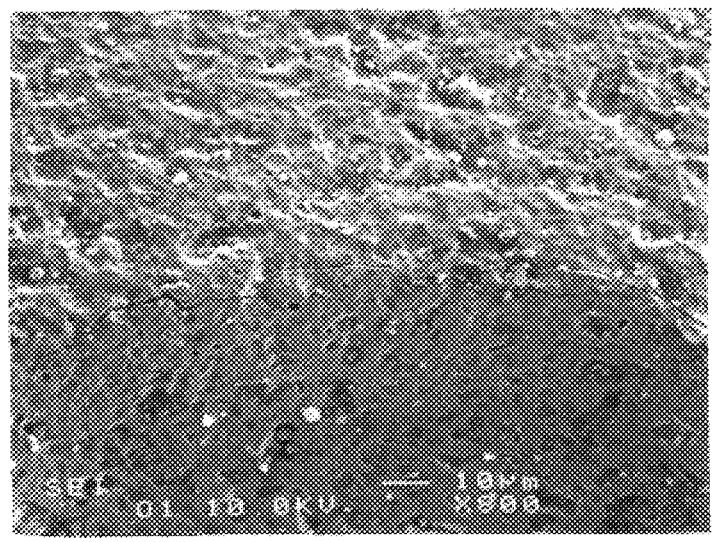
Figure 7C:
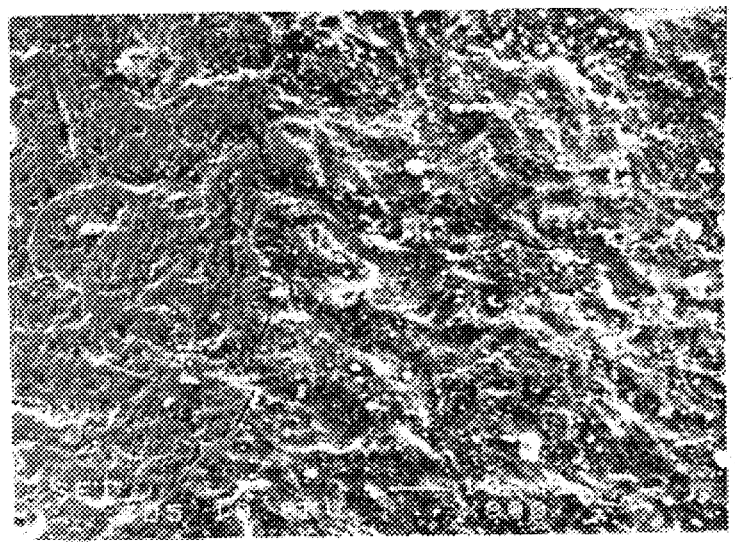
Figure 7D:
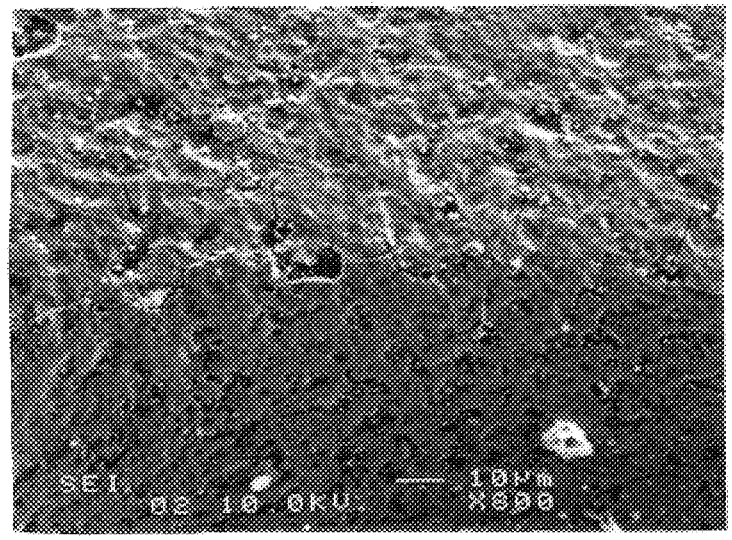
Figure 7E:
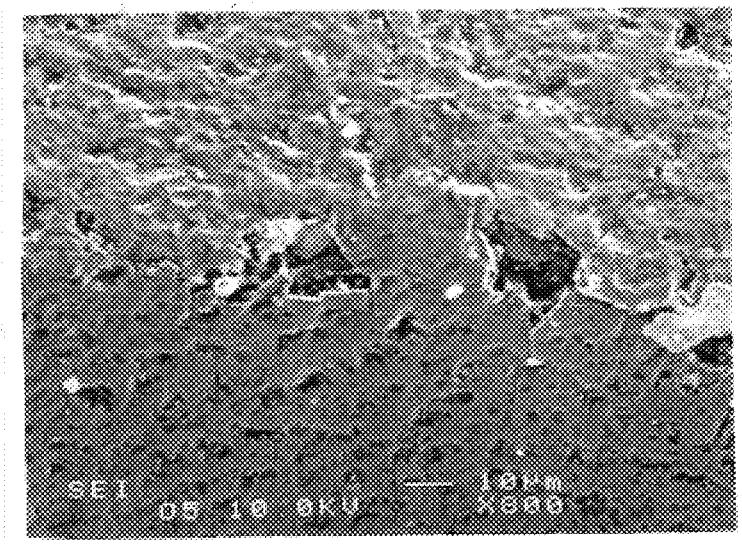

No: without repolishing, but CrN deposition immediately
600:repolishing with #600 grinding paper, followed by CrN deposition
1000:repolishing with #1000 grinding paper, followed by CrN deposition
1800:repolishing with #1800 grinding paper, followed by CrN deposition
D: repolishing with #1000 grinding paper and diamond paste, followed by CrN deposition FIG. 1. The flow chart of the present invention
FIG. 2. (a) Cross-section micrographs of a 3.6 μm CrN layer. X-ray map showing (b) the Cr-rich and (c) the Fe-rich phases on the coating.
FIG. 3. Surface failure modes around Rockwell-N impact indentation.
FIG. 4. X-ray diffraction patterns of (a) nitrocarburized, (b) gas nitrided, (c) plasma nitrided layers and (d) SKD 61 tool steel.
FIG. 5. X-ray diffraction patterns of CrN coating deposited on (a)nitrocarburized, (b)gas nitrided, (c)plasma nitrided layers and (d) single CrN coating samples.
FIG. 6. Concentration profiles of CrN coating deposited on a) nitrocarburized, (b) gas nitrided, (c) plasma nitrided layers and (d) single CrN coating sample by GDS.
FIG. 7. Typical indentation crack patterns observed on (a)P, 100 Kgf, CrNPN, (b) C2, 15 Kgf, CrNonly, (c) C2, 100 Kgf, CrNNC, (d) F1, 30 Kgf, CrNonly and (e) F2, 100 Kgf, CrNonly. P—Perfect C1—slightly horizontal crack C2—light vertical and horizontal crack F1—C2with slight peeling off F2—C2with completely peeling off

DESCRIPTION OF THE INVENTION

The present invention included pretreatment, nitriding, repolishing, and CrN hard layer deposition. The pretreatment included polishing the tool steel with up to #1000 SiC griding paper, followed by cleaning with acetone and watching with deionized water in an ultrasonic cleaner.

Once the tool steel was cleaned, it was placed in a furnance for carburizing at temperature of 460° to 560° C. Upon carburizing, the ratio of nitrogen to carbon for the film on the surface of the tool steel was analyzed by a glow discharge spectrophotometer(GDS). Then repolishing, cleaning with acetone and watching with deionized water were performed. Again the tool steel was placed in cathodic arc plasma deposition chamber to clean, followed by CrN layer deposition. As illustrated in FIG. 1, repolishing adopted #600, #1000, #1800, and #1000 grinding papers and diamond paste, respectively. The present invention was applicable to all tool steels for cutting and molding.

The common method for nitriding generally included (1) nitrocarburizing, (2) gas nitriding, (3) plasma nitriding. Any one of these was a good choice for the present invention. However, the condition and apparatus needed slight modifications. For nitrocarburizing, the furnance was filled with 50% of ammonia and 50% of RX, the temperature setting was 460° to 560° C. The treatment was under pressure for 4 hours. The gas RX was produced in a 950° C furnance by mixing 63% of air and 37% of propane. For gas nitriding, the furnance was filled with ammonia gas, the temperature setting was 460° to 560° C. For plasma nitriding, a plasma deposition furnance equipped with 460 V arc was used, and the furnance was filled with 25% nitrogen and 75% hydrogen, and the temperature setting was 460° to 560° C. The pressure setting was 300 Pa.

X-ray diffraction was used to examine the structures of such coated sample. As shown in FIG. 1, the main phase of plasma nitrided, gas nitrided and nitrocarburized layers is $\epsilon$—$Fe_{2-3}N$, and $\epsilon$—$Fe_{2-3}(C, N)$ respectively. X-ray diffraction analysis for the CrN coating was also shown in FIG. 2. It was found that the coatings are composed mainly of CrN. Glow discharge spectrometer(GDS) was used to analyze the quantitative concentration depth profile and each element concentration in the coated layer. When a GDS was applied with voltage of 699 V and current of 21 mA, sputter rate of GDS is approximately 20 nm/sec. Ratios of nitrogen to carbon for different methods were found as follows: gas nitriding was 8.69%: 0. Nitrocarburizing, 6.02%: 3.22%. Plasma nitriding, 7.65%: 0.

The surface hardness required for the tool steel was 392 $HV_{0.010}$. Values of hardness measured after different methods of treatment were listed in Table 2. $HV_{0.050}$ referred to hardness obtained by using a Vickers hardness tester. From results shown in Table 3 and 4, nitriding tool steel repolished with different grinding papers, followed by CrN deposition obtained a film with superior adhesive strength. The highest adhesive strength of CrN film was found to be the one treated respectively with CrNPN and CrNPN, and repolishing by #1000 grinding paper, followed by CrN deposition.

EXAMPLES

Example 1A

Treatment for nitrocarburized tool steel (NCSKD)

The tool steel used in this example contained 0.30% carbon, 0.73% of silicon, 0.69% manganese, 0.12% sulfur, 4.95% of chromium, 1.01% of molybdenum, 0.41% vanadum. Commercial tool steel hardness was HRC 37.

The tool steel was first polished with SiC grinding paper down to 1000 grit, followed by cleaning with acetone and watching with deionized water in a ultrasonic cleaner for 15 minutes. Then the tool steel was placed in a furnance, the temperature was 500° to 580° C., and the furnance was filled with 50% amonia gas and 50% of RX gas. This thermal treatment for nitrocarburizing took 4 hours. The RX gas was produced by 63% air and 37% propane at 950° C.

The ratio of nitrogen to carbon in the film on the surface of the tool steel(NCSKD) was determined to be 6.02%:3.22%.

Example 1B

Repolishing and deposition of CrN film

The nitrocarburized tool steel(NCSKD) in example 1A was repolished with different grinding papers, then cleaned with acetone and watched with deionized water in a ultrasonic cleaner for 15 minutes. The tool steel was placed in a cathodic arc plasma deposition chamber. Before coating, the tool steel was cleaned again under hydrogen gas at a pressure of 120 millitorr and −1000 volts for 30 minutes. Then the CrN film(CrNNC) deposition was started for 30 minutes under nitrogen gas pressure of 25 millitorr, the voltage was −100 volts, and the temperature was 200° C., the rate of deposition was 2 nm/sec.

The repolishing processes included (1) without repolishing, (2) repolishing with #600 grinding paper, (3) repolishing with #1000 grinding paper, (4) repolishing with #1800 grinding paper, (5) repolishing with #1000 grinding paper and diamond paste, respectively.

Example 2A

Gas nitriding of tool steel (GNSKD)

The tool steel used in this example contained 0.30% carbon, 0.73% of silicon, 0.69% manganese, 0.12% sulfur, 4.95% of chromium, 1.01% of molybdenum, and 0.41% vanadum. The commercial tool steel hardness was HRC 37.

The tool steel was polished with SiC grinding paper down to 1000 grit, followed by cleaning with acetone and watching with deionized water in a ultrasonic cleaner for 15 minutes. Then the tool steel was placed in a thermal furnace, the temperature was 460° to 560° C., and the furnace was filled with pure amonia gas. The gas nitriding process took about 6 hours.

The ratio of nitrogen to carbon in the film on the surface of the tool steel(GNSKD) was determined to be 8.692%: 0%.

Example 2B

Repolishing and deposition of CrN film

The gas nitrited tool steel(GNSKD) in example 2A was repolished with different grinding papers, then cleaned with acetone and watched with deionized water in a ultrasonic cleaner for 15 minutes. The tool steel was placed in a cathodic arc plasma deposition chamber. Before coating, the tool steel was cleaned again under hydrogen gas at a pressure of 120 millitorr and voltage of −1000 volts for 30 minutes. Then the CrN film(CrNGN) coating process was started for 30 minutes under nitrogen gas pressure of 25 millitorr, the voltage was −100 volts, and the temperature was 200° C., the rate of coating was 2 nm/sec.

The repolishing process included (1) without repolishing, (2) repolishing with #600 grinding paper, (3) repolishing with #1000 grinding paper, (4) repolishing with #1800 grinding paper., (5) repolishing with #1000 grinding paper and diamond paste, respectively.

Example 3A

Plasma nitriding of tool steel (PNSKD)

The tool steel used in this example contained 0.30% carbon, 0.73% of silicon, 0.69% manganese, 0.12% sulfur, 4.95% of chromium, 1.01% of molybdenum, and 0.41% vanadum. The commercial tool steel hardness was HRC 37.

The tool steel was polished with SiC grinding paper down to 1000 grit, followed by cleaning with acetone and watching with deionized water in a ultrasonic cleaner for 15 minutes. Then the tool steel was placed in a plasma nitriding furnance, the temperature was 460° to 560° C., and the furnance was filled with 25% nitrogen gas and 75% of hydrogen gas, the total pressure was 300 Pa. The voltage of the arc plasma nitriding furnance was 460 V.

The ratio of nitrogen to carbon in the film on the surface of the tool steel(PNSKD) was determined to be 7.65%: 0%.

Example 3B

Repolishing and deposition of CrN film

The plasma nitrided tool steel(PNSKD) in example 3A was repolished with different grinding papers, then cleaned with acetone and watched with deionized water in a ultrasonic cleaner for 15 minutes. The tool steel was placed in a cathode arc plasma deposition chamber. Before coating, the tool steel was cleaned again under hydrogen gas at a pressure of 120 millitorr and −1000 volts for 30 minutes. Then the CrN film(CrNPN) coating process was started for 30 minutes under nitrogen gas pressure of 25 millitorr, the voltage was −100 volts, and the temperature was 200° C., the rate of coating was 2 nm/sec.

The repolishing processes included (1) without repolishing, (2) repolishing with #600 grinding paper, (3) repolishing with #1000 grinding paper, (4) repolishing with #1800 grinding paper, (5) repolishing with #1000 grinding paper and diamond paste, respectively.

TABLE 1

| Sample | PNSKD | GNSKD | NCSKD |
|---|---|---|---|
| Nitrogen (wt %) | 7.65% | 8.69% | 6.02% |
| Carbon (wt %) | 0% | 0% | 3.22% |

TABLE 2

| Sample | Condition | $HV_{0.050}$ | $HV_{0.100}$ | $HV_{0.300}$ |
|---|---|---|---|---|
| CrNNC | CrN/nitrocarburized | 1354 | 1159 | 881 |
| CrNGN | CrN/gas nitrided | 1282 | 1192 | 1083 |
| CrNPN | CrN/plasma nitrided | 1460 | 1322 | 1003 |
| CrNonly | CrN coating only | 1138 | 906 | 560 |
| NCSKD | Nitrocarburized | 735 | 654 | 513 |
| GNSKD | Gas nitrided | 702 | 702 | 694 |
| PNSKD | Plasma nitrided | 721 | 683 | 612 |
| SKD61 | Substrate (SKD 61) | 392 | 390 | 386 |

TABLE 3

| | Load 15 kgf | Load 30 kgf | Load 45 kgf | Load 60 kgf | Load 100 kgf |
|---|---|---|---|---|---|
| CrNNC | P | P | P | P | C2 |
| CrNGN | P | P | P | P | P |
| CrNPN | P | P | P | P | P |
| CrNonly | C1 | F1 | F2 | F2 | F2 |

TABLE 4

| Sample | CrNonly | CrNPN | CrNGN | CrNNC |
|---|---|---|---|---|
| No* | | 30.3 N | 29.5 N | 20.8 N |
| 600** | | 33.9 N | 33.5 N | 21.4 N |
| 1000** | 12.2 N | 38.3 N | 38.2 N | 25.9 N |
| 1800** | | 36.4 N | 36.6 N | 25.4 N |
| D*** | 14.3 N | 24.8 N | 26.1 N | 18.2 N |

We claim:

1. A process for increasing the adhesive strength and hardness of a CrN layer on a surface of tool steel comprising
   polishing with grinding paper a surface of tool steel,
   nitriding the polished surface of said tool steel,
   repolishing with grinding paper said nitrided surface of said tool steel,
   depositing a layer of CrN on said nitrided surface of said tool steel to form a hard layer containing 6.0–8.7% by weight nitrogen and 0–3.2% by weight carbon.

2. The process as defined in claim 1
   wherein said polishing step further includes cleaning said polished tool steel surface with acetone, and then washing said tool steel surface with deionized water in an ultrasonic cleaner.

3. The process as defined in claim 1
   wherein said nitriding step includes nitrocarburizing, gas nitriding, or plasma nitriding.

4. The process as defined in claim 1
   wherein said repolishing step includes repolishing with a member selected from the group consisting of #600 grinding paper, #1000 grinding paper, and #1800 grinding paper.

5. The process as defined in claim 1
   further comprising after said repolishing step cleaning said tool steel surface with acetone, and
   washing said tool steel surface with deionized water in an ultrasonic cleaner.

6. The process as defined in claim 1
   wherein said nitriding step further comprises nitrocarburizing said tool steel surface in a furnace at a temperature of 500°–580° C.,
   wherein said furnace is filled with a gas containing equal parts of ammonia gas and RX gas, said RX gas is produced by heating air and propane at 950° C.

7. The process as defined in claim 6
   wherein said tool steel surface is nitrocarburized for four hours.

8. The process as defined in claim 1
   wherein said nitriding step further comprises gas nitriding said tool steel surface in a thermal furnace filled with pure ammonia gas at a temperature of 460°–560° C.

9. The process as defined in claim 8
   wherein said tool steel surface is nitrided for about six hours.

10. The process as defined in claim 1
    wherein said nitriding step further comprises plasma nitriding said tool steel surface in a plasma nitriding furnace filled with a gas mixture containing 25% nitrogen gas and 75% hydrogen gas at a temperature of 460°–560° C.

11. The process as defined in claim 1
    wherein said depositing step further comprises depositing said CrN as a film on said tool steel surface under a nitrogen gas pressure of 25 millitorr, at a voltage of −100 volts, a temperature of 200° C., and at a deposition rate of 2 nm/sec for 30 minutes.

12. A process for modifying the surface of tool steel consisting essentially of
    polishing with grinding paper a surface of tool steel,
    cleaning said polished tool steel surface with acetone,
    then washing said tool steel surface with deionized water in an ultrasonic cleaner, nitriding said polished tool steel surface using a step which is a member of the group consisting of
a) nitrocarburizing said tool steel surface in a furnace at a temperature of 500°–580° C.,
wherein said furnace is filled with a gas containing equal parts of ammonia gas and RX gas, said RX gas is produced by heating air and propane at 950° C.,
b) gas nitriding said tool steel surface in a thermal furnace filled with pure ammonia gas at a temperature of 460°–560° C., and
c) plasma nitriding said tool steel surface in a plasma nitriding furnace filled with a gas mixture containing 25% nitrogen gas and 75% hydrogen gas at a temperature of 460°–560° C., repolishing with #600, #1000, or #1800 grinding paper said nitrided tool steel surface, cleaning said repolished tool steel surface with acetone, then washing said repolished tool steel surface with deionized water in an ultrasonic cleaner, depositing a layer of CrN on said nitrided surface of said tool steel under a nitrogen gas pressure of 25 millitorr, at a voltage of −100 volts, a temperature of 200° C., and at a deposition rate of 2 nm/sec for 30 minutes, to form a hard layer containing 6.0–8.7% by weight nitrogen and 0–3.2% by weight carbon.

* * * * *